(12) United States Patent
Wang et al.

(10) Patent No.: US 8,871,575 B2
(45) Date of Patent: Oct. 28, 2014

(54) METHOD OF FABRICATING FIELD EFFECT TRANSISTOR WITH FIN STRUCTURE

(75) Inventors: Chih-Jung Wang, Hsinchu (TW); Tong-Yu Chen, Hsinchu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 98 days.

(21) Appl. No.: 13/284,987

(22) Filed: Oct. 31, 2011

(65) Prior Publication Data

US 2013/0105867 A1 May 2, 2013

(51) Int. Cl.
  *H01L 21/00* (2006.01)
  *H01L 29/66* (2006.01)
  *H01L 29/78* (2006.01)

(52) U.S. Cl.
  CPC .... *H01L 29/66545* (2013.01); *H01L 29/66818* (2013.01); *H01L 29/7851* (2013.01)
  USPC .............. 438/151; 257/E29.052; 257/E29.13

(58) Field of Classification Search
  USPC ...................... 438/151; 257/E29.13, E29.052
  See application file for complete search history.

(56) References Cited

U.S. PATENT DOCUMENTS

| | | | |
|---|---|---|---|
| 6,043,138 A | 3/2000 | Ibok | |
| 6,492,216 B1 | 12/2002 | Yeo | |
| 6,855,607 B2 | 2/2005 | Achuthan | |
| 6,921,963 B2 | 7/2005 | Krivokapic | |
| 7,013,446 B2 | 3/2006 | Ohba | |
| 7,087,477 B2 | 8/2006 | Fried | |
| 7,091,551 B1 | 8/2006 | Anderson | |
| 7,112,495 B2 | 9/2006 | Ko | |
| 7,247,887 B2 | 7/2007 | King | |
| 7,250,658 B2 | 7/2007 | Doris | |
| 7,309,626 B2 | 12/2007 | Ieong | |
| 7,352,034 B2 | 4/2008 | Booth, Jr. | |
| 7,470,570 B2 | 12/2008 | Beintner | |
| 7,521,324 B2 | 4/2009 | Ohmi | |
| 7,531,437 B2 | 5/2009 | Brask | |
| 7,569,857 B2 | 8/2009 | Simon | |
| 7,592,270 B2 | 9/2009 | Teo | |
| 2004/0195624 A1 | 10/2004 | Liu | |
| 2005/0051825 A1 | 3/2005 | Fujiwara | |
| 2006/0099830 A1 | 5/2006 | Walther | |
| 2006/0286729 A1 | 12/2006 | Kavalieros | |
| 2007/0015365 A1 | 1/2007 | Chen | |

(Continued)

OTHER PUBLICATIONS

Daniel Tekleab, S. Samavedam, and P. Zeitzoff, "Modeling and Analysis of Parasitic Resistance in Double-Gate FinFETs," IEEE Transactions on Electron Devices, vol. 56, No. 10, Oct. 2009, pp. 2291-2296, Sep. 23, 2009.

(Continued)

*Primary Examiner* — Amar Movva
(74) *Attorney, Agent, or Firm* — Winston Hsu; Scott Margo

(57) ABSTRACT

A method of fabricating a field effect transistor with a fin structure is described. At least a fin structure is formed on a substrate. A planar insulation layer covering the fin structure is formed. A trench is formed in the insulation layer and intersects the fin structure both lengthwise. The trench is disposed over portions of the fin structure, and a lengthwise direction of the trench intersects a lengthwise direction of the fin structure, and thereby an upper portion of the fin structure is exposed to the trench. The exposed upper portion of the fin structure will serve as a gate channel region. A gate structure covering the upper portion is formed within the trench. The upper portion of the fin structure may be further trimmed.

12 Claims, 8 Drawing Sheets

(56) References Cited

U.S. PATENT DOCUMENTS

| | | |
|---|---|---|
| 2007/0072376 A1 | 3/2007 | Chen |
| 2007/0108528 A1 | 5/2007 | Anderson |
| 2007/0158756 A1 | 7/2007 | Dreeskornfeld |
| 2007/0218661 A1 | 9/2007 | Shroff |
| 2008/0061366 A1 | 3/2008 | Liu |
| 2008/0157208 A1 | 7/2008 | Fischer |
| 2009/0057759 A1 | 3/2009 | Obradovic |
| 2009/0124097 A1 | 5/2009 | Cheng |
| 2009/0200494 A1 | 8/2009 | Hatem |
| 2009/0242964 A1 | 10/2009 | Akil |
| 2009/0269916 A1 | 10/2009 | Kang |
| 2010/0044783 A1 | 2/2010 | Chuang |
| 2010/0048027 A1 | 2/2010 | Cheng |
| 2010/0072553 A1 | 3/2010 | Xu |
| 2010/0129994 A1 | 5/2010 | Awad |
| 2010/0144121 A1 | 6/2010 | Chang |
| 2010/0167506 A1 | 7/2010 | Lin |
| 2011/0121406 A1 | 5/2011 | Lee |

OTHER PUBLICATIONS

Mayank Shrivastava; Ruchit Mehta; Shashank Gupta; Nidhi Agrawal; Maryam Shojaei Baghini; Dinesh Kumar Sharma; Thomas Schulz; Klaus von Arnim; Wolfgang Molzer; Harald Gossner; and V. Ramgopal Rao, "Toward System on Chip (SoC) Development Using FinFET Technology: Challenges, Solutions, Process Co-Development & Optimization Guidelines," IEEE Transactions on Electron Devices, vol. 58, No. 6, Jun. 2011, pp. 1597-1607, Apr. 7, 2011.

METHOD OF FABRICATING FIELD EFFECT TRANSISTOR WITH FIN STRUCTURE

BACKGROUND OF THE INVENTION

1. Field of the Invention

The present invention relates to a method of fabricating a field effect transistor (FET) with a fin structure, and, particularly, to a method of fabricating a FET with a fin structure through forming a gate structure using a step similar to a damascene process.

2. Description of the Prior Art

With the trend in the industry being towards scaling down the size of metal oxide semiconductor transistors (MOS), three-dimensional or non-planar transistor technology, such as fin field effect transistor technology (Fin-FET) has been developed to replace planar MOS transistors. The three-dimensional structure of a fin-FET increases the overlapping area between the gate and the fin structure of the silicon substrate, and accordingly, the channel region is more effectively controlled. The short channel effect which miniaturized devices may encounter is therefore reduced. The channel region is also wider under the same gate length, and thus the current between the source and the drain is increased.

Since the fin-FET devices have the aforesaid advantages, there is still a need for novel fin-FET devices and methods of fabricating the same to improve performance.

SUMMARY OF THE INVENTION

An objective of the present invention is to provide a method of fabricating a FET with a fin structure, in which, a gate structure is formed through a process similar to damascene and well self-aligned.

Another objective of the present invention is to provide a FET with a fin structure, in which, a width of a gate channel region of an exposed upper portion of the fin structure is less than each of widths of the source region and the drain region and a gate structure is well aligned with the gate channel region.

According to an aspect of an embodiment of the present invention, the method of fabricating a FET with a fin structure includes steps as follows. First, a substrate is provided. The substrate is allowed to have at least one fin structure thereon. Thereafter, a planar first insulation layer is formed on the substrate to cover the fin structure. The first insulation layer is partially removed to a depth to form a trench. The trench is allowed to intersect the fin structure, such that an upper portion of the fin structure is exposed to the trench. Thereafter, a gate structure covering the exposed upper portion of the fin structure is formed in the trench.

According to another aspect of an embodiment of the present invention, the FET with a fin structure includes a substrate, an isolation structure and a gate structure. The substrate includes at least one fin structure. The fin structure includes two source/drain regions and a gate channel region between the two source/drain regions. The isolation structure is disposed on the substrate and surrounds the fin structure to expose an upper portion of the fin structure. A width of the gate channel region of the exposed upper portion of the fin structure is less than each of widths of the source region and the drain region. A gate structure covering two sidewalls of the gate channel region of the exposed upper portion of the fin structure is formed. Two sidewalls of the gate structure contact two facing sidewalls of the two source/drain regions, respectively.

In the present invention, a process similar to damascene is utilized to form a trench within an insulation layer to expose an upper portion of a gate channel region of a fin structure, and thereafter agate structure covering the gate channel region is formed within the trench. Accordingly, in the process, the gate structure and the gate channel region are self-aligned with each other. Furthermore, in the process, the insulation layer may include amorphous material to avoid a rough surface due to crystal grains, and accordingly the trench may have a smooth surface and the resultant gate structure may have a relative fine and straight edge with respect to a conventional gate structure obtained from patterning directly through an etching process. Furthermore, in a certain embodiment, a trim process may be further performed to reduce the width of the exposed upper portion of the fin structure; while the source/drain regions may be still in the original width. Accordingly, the problems of short channel effect, such as drain induced barrier lowering (DIBL), sub-threshold slope and $V_t$ roll-off effect, can be improved. Furthermore, the gate structure and the gate channel region are well self-aligned with each other, such that, the two sidewalls of the gate structure contact two sidewalls, which face each other, of the two source/drain regions S/D, respectively. No gap is between the gate structure and the source/drain region. Accordingly, in addition that the problems of short channel effect are improved, a low parasitic resistance between the gate structure and the source/drain can be also obtained.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1 to 8 are schematic diagrams illustrating a method of fabricating a FET with a fin structure according to an embodiment of the present invention, in which, FIGS. 1 to 5, 7 and 8 are schematic cross-sectional views and FIG. 6 is a perspective view;

DETAILED DESCRIPTION

Referring to FIGS. 1 to 8, a method of fabricating a FET with a fin structure according to an embodiment of the present invention is described hereinafter. First, referring to FIG. 1, a substrate 10, such as semiconductor substrate including for example a silicon substrate, is provided. At least one fin structure 12 is formed on the substrate. The fin structures 12 may be formed, for example, by means of etching the original substrate 10 through a patterned hard mask 14 formed thereon.

Thereafter, according to one feature of the present invention, a planar insulation layer is formed on the substrate to cover the fin structure. The insulation layer is partially removed to a depth to form a trench. The trench is allowed to intersect the fin structure both in their lengthwise direction, such that an upper portion of the fin structure is exposed to the trench. The way for partially removing the insulation layer to a desired depth may be various, for example, but not limited thereto, by means of etching the insulation layer through a patterned mask or hard mask to a desired or predetermined depth to form a trench within the insulation layer; or by means of disposing an etch stop layer between two insulation layers at a desired depth and then carrying out an etching process through a patterned mask or hard mask; or disposing two insulation layers having different etching rates and then carrying out an etching process through a patterned mask or hard mask for a desired etch stop. FIG. 1 through FIG. 8 illustrate an embodiment using an etch stop layer between two insulation layers for forming the trench.

Figure 1:
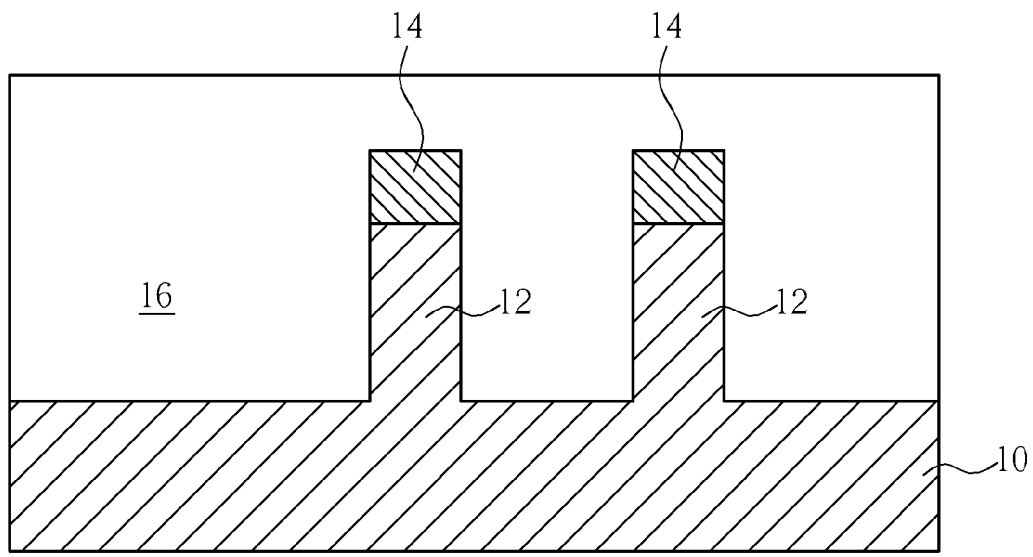
Figure 2:
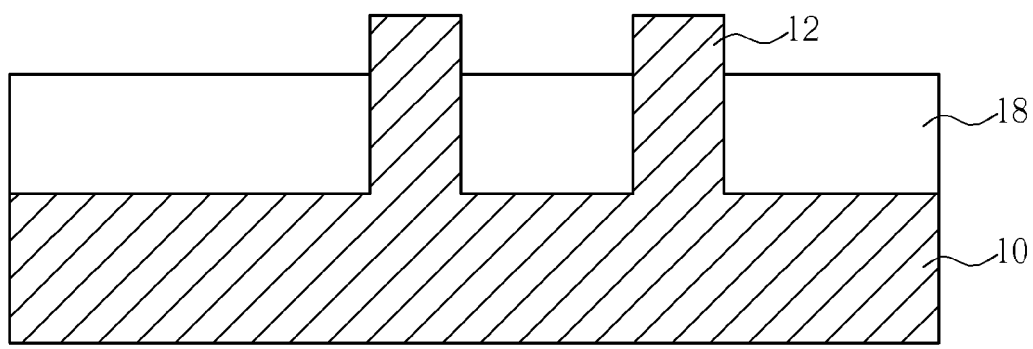

Still referring to FIG. 1, an insulation layer 16 is formed on the substrate 10 and higher than the fin structure 12 to cover it. The insulation layer 16 is planarized through for example a chemical mechanical polishing (CMP) process. Thereafter, referring to FIG. 2, an etching process, or referred to as etch-back process, is performed on the planar insulation layer 16 for partial removal it. This etch may be performed all over on the substrate until a desired height of upper portion of the fin structure 12 is exposed. The rest of the insulation layer 16 is denoted by the referral number 18. The insulation layer 18 may serve as an isolation structure, such as a shallow trench isolation (STI). Accordingly, the insulation layer 16 may include for example silicon oxide. The hard mask 14 may be removed or remain. FIG. 2 shows a situation that the hard mask 14 is removed.

Figure 3:
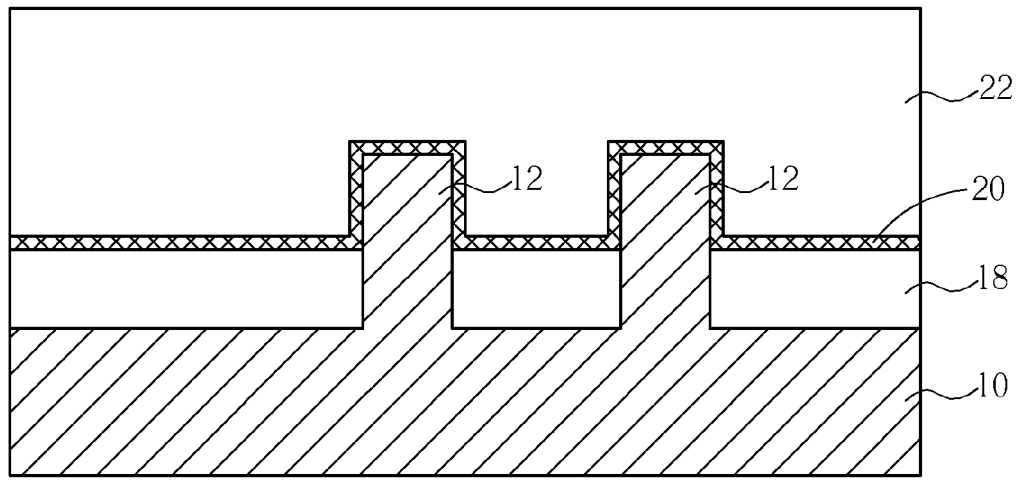

Thereafter, referring to FIG. 3, an etch stop layer 20 is formed on the insulation layer 18 and the upper portion of the fin structure 12. Thereafter, an insulation layer 22 covering the etch stop layer 20 is formed. The insulation layer 22 maybe further planarized. The etch stop layer 20 and the insulation layer 22 may independently include, for example, silicon nitride (briefly noted as SiN) or an oxide, but are not limited thereto.

Figure 4:
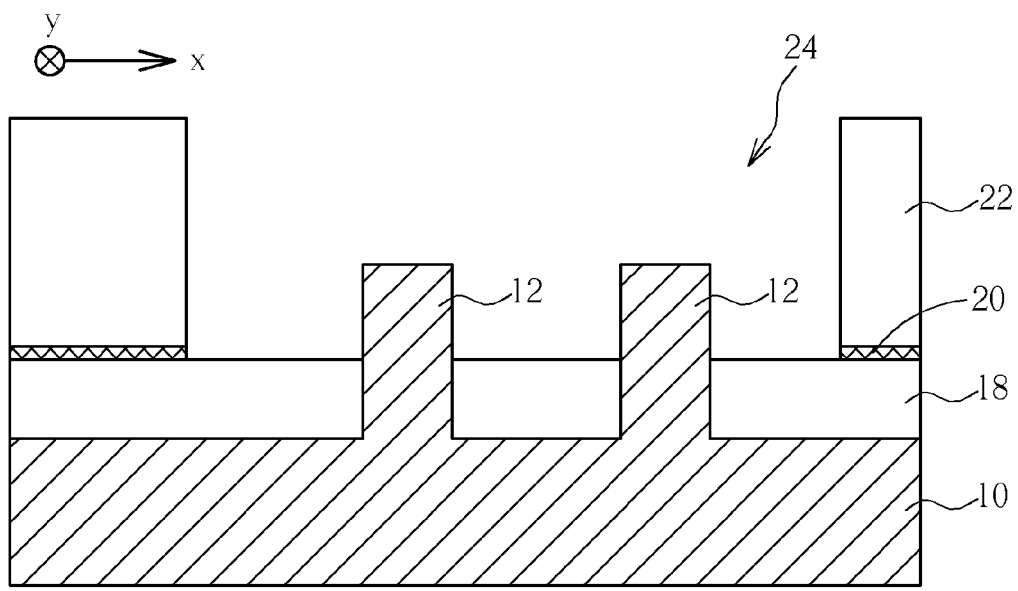
Figure 5:
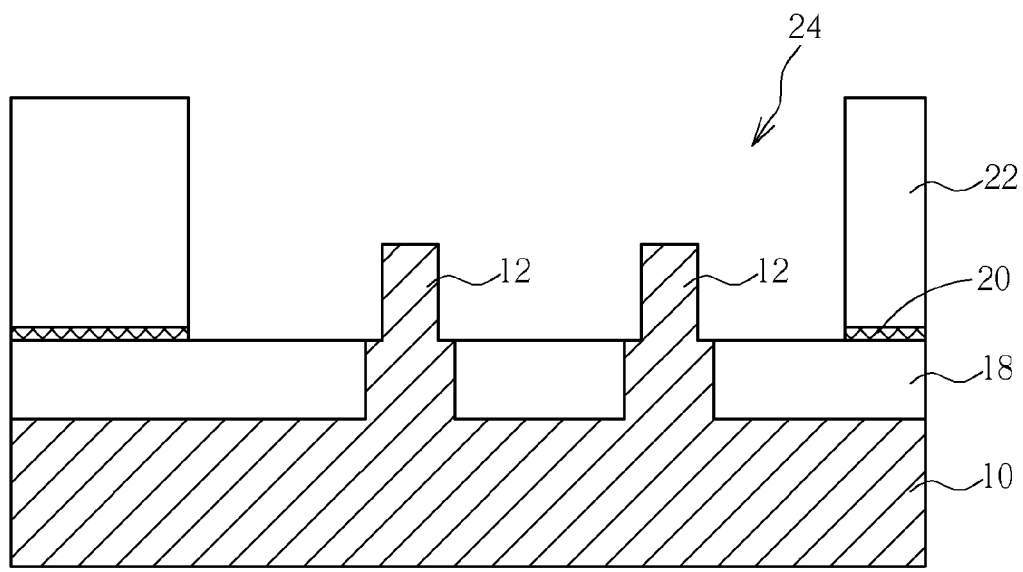

Thereafter, referring to FIG. 4, the insulation layer 22 is partially removed to a depth to form a trench 24. For example, the trench may be formed by means of etching the insulation layer 22 through a patterned mask or hard mask to the depth of the etch stop layer 20. The trench 24 in its lengthwise direction (the direction x as shown in FIG. 4) and the fin structure 12 in its lengthwise direction (the direction y perpendicular to the paper as shown in FIG. 4) are allowed to intersect each other. The insulation layer 22 is etched to the depth where the etch stop layer 20 is disposed, and thus an upper portion of the fin structure 12 within the trench is exposed. This exposed portion of the fin structure 12 will serve as a gate channel. The portion of the fin structure 12 to serve source/drain regions is still covered with the insulation layer 22. The etch stop layer 20 within the trench 24 may be further removed.

In another aspect of an embodiment, instead of forming the etch stop layer 20, two insulation layers having different etching rates, i.e. having an etch selection ratio with respect to each other, are formed for an indication for stopping the etch as aforesaid.

Figure 6:
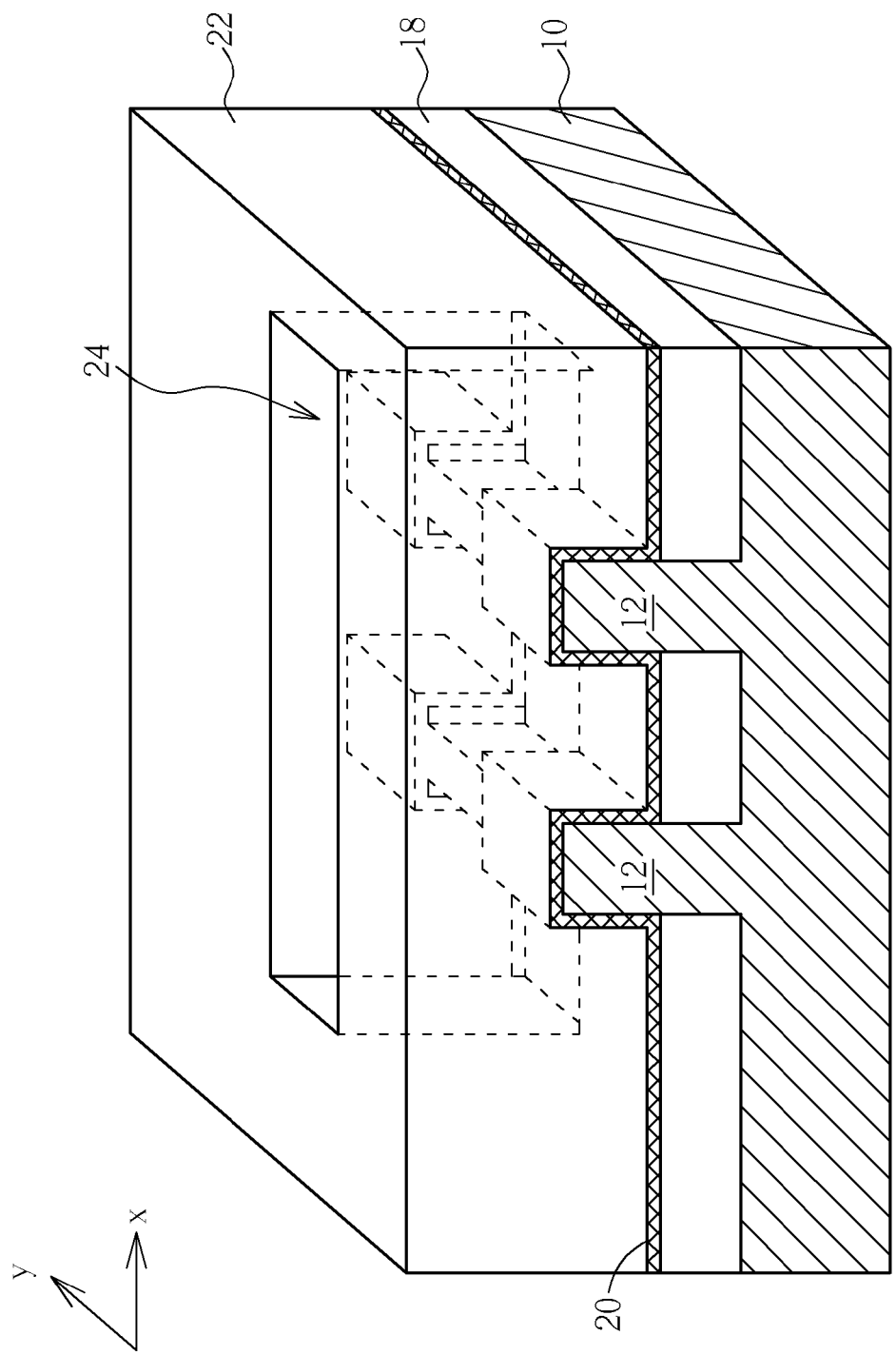
Figure 7:
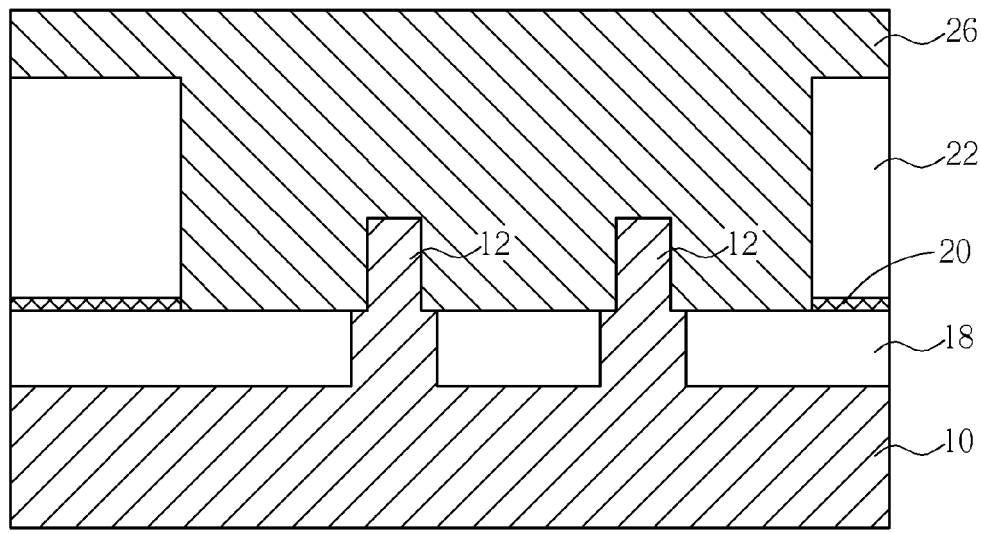
Figure 8:
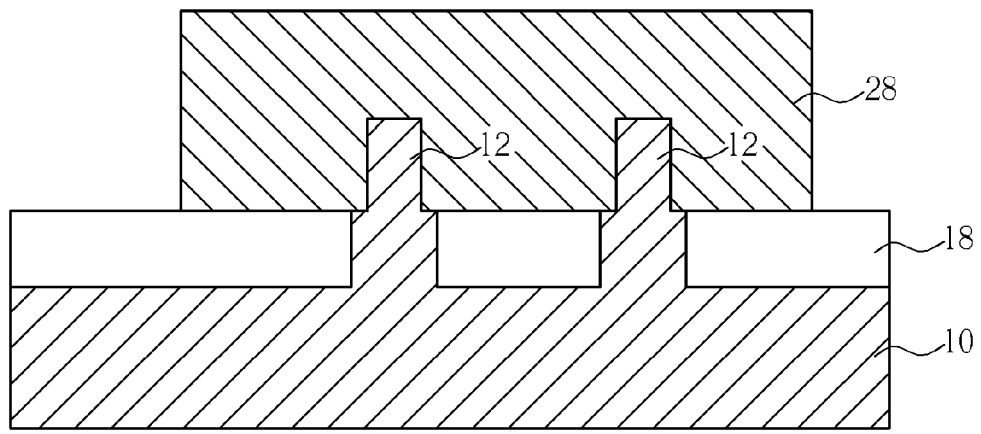

Thereafter, the exposed portion of the fin structure 12 may serve for a gate channel, or it may be further reduced in width through a trim process. For example, in an embodiment illustrated by FIG. 5, a trim process is performed to reduce the width of the exposed upper portion of the fin structure 12 in the trench 24. The trim process may be performed by means of for example isotropic dry or wet etch, but not limited thereto, or further reducing the width of the hard mask atop the fin structure, to further remove a thickness of the fin structure by etching. FIG. 6 is a perspective view illustrating the structure after the trim process is performed. The width of the trimmed fin structure 12 may be for example 10 to 30 nm. The height of the exposed portion of the fin structure 12 is preferably about one to five times of the width, but not limited thereto.

A gate dielectric layer (not shown) may be formed on the exposed upper portion of the fin structure 12. Thereafter, a gate is formed in the trench 24 to cover the channel region of the fin structure 12. Various ways may be available for forming the gate. For example, referring to FIG. 7, the trench 24 may be filled with gate material utilizing for example a CVD process to become a gate material layer 26 further covering a top of the insulation layer 22. The gate material may include for example silicon or metal. When a gate dielectric layer is formed on the exposed upper portion of the fin structure 12, the later-formed gate material layer 26 will cover the gate dielectric layer. The "gate structure" herein may include a gate material layer, or may include a gate dielectric layer and a gate material layer.

Thereafter, a planarization process, such as a CMP process, is performed to planarize the surface of the gate material layer 26 to expose the insulation layer 22. Thereafter, referring to FIG. 8, the insulation layer 22 maybe removed through for example an etching process to expose the gate 28 and the portion of the fin structure 12 not covered with the gate 28. Since the insulation layer 22 may be removed and not remain in the structure, the suitable material is not limited to the material frequently used for interlayer dielectric (for example silicon oxide). Other material can be utilized as soon as it is not harmful to the processes and the structure and the purpose as described above can be attained. The rest of the etch stop layer 20 may be further removed.

A source and a drain are formed in the fin structure at two sides of the gate 28. For example, a spacer is formed on the sidewall of the gate and the source/drain regions are implanted with dopants through an ion implantation. The gate 28 covers the exposed upper portion, including two sidewalls and top, of the fin structure 12 and becomes a tri-gate FET configuration. Furthermore, the gate 28 and the trimmed gate channel are aligned with each other without particular alignment processes. Accordingly, it may be referred to as a self-alignment process.

Figure 9:
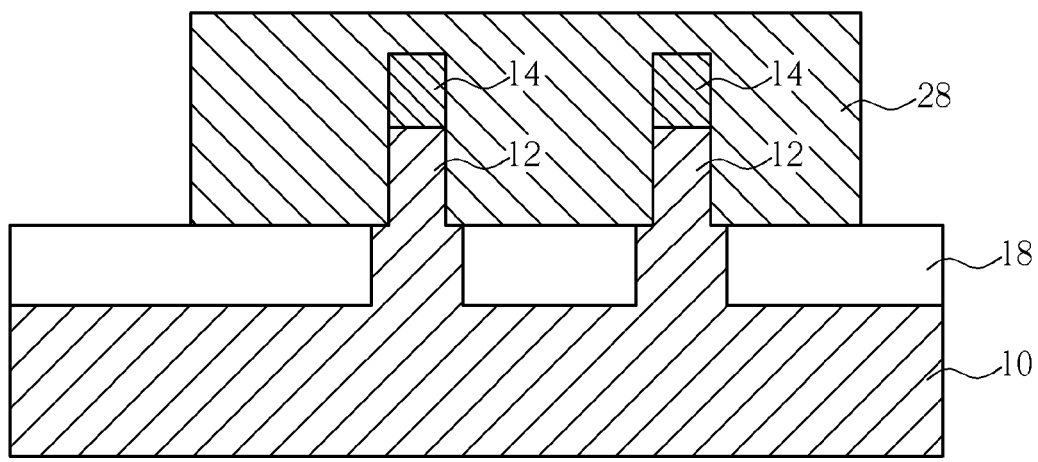
FIG. 9 is a schematic cross-sectional view illustrating a FET with a fin structure according to another embodiment of the present invention.

As aforesaid, after the fin structure 12 is formed, the hard mask layer 14 may be removed or allowed to remain. In the situation that the hard mask layer 14 remains, a trim process can be also performed on the fin structure 12 as described above. For example, an isotropic etching process may be performed on the trench 24. Or, a trim process is performed on the hard mask 14 to reduce the width and thereafter the gate channel region is etched to reduce the width. FIG. 9 illustrates an embodiment of a FET with a fin structure and a hard mask atop the fin structure after the trim process is performed. In this embodiment, the thickness of the hard mask layer 14 may be relatively thick, and the gate structure thus formed may have a configuration similar to a tri-gate structure but possess electric properties similar to a double-gate.

Figure 10:
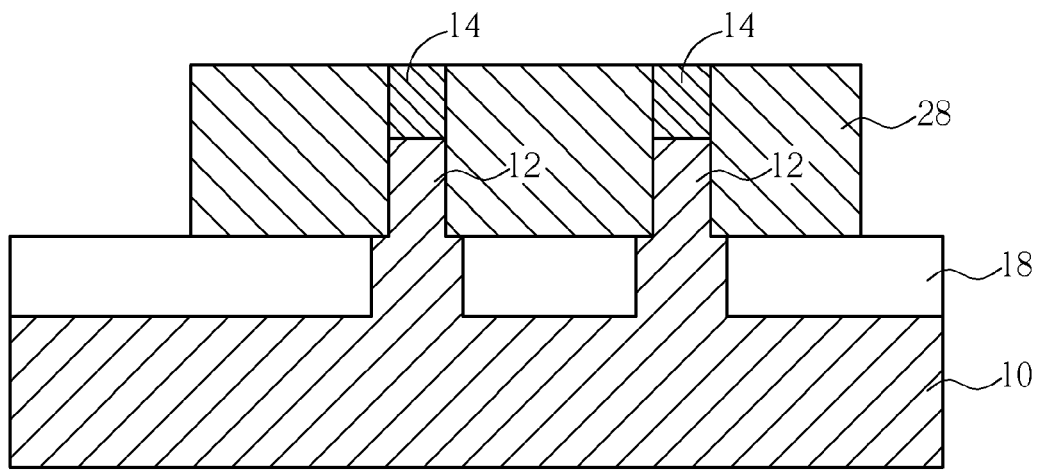
FIG. 10 is a schematic cross-sectional view illustrating a FET with a fin structure according to still another embodiment of the present invention.

FIG. 10 illustrates an embodiment varied with respect to the embodiment shown in FIG. 9. In this embodiment, the gate material layer is planarized to expose the hard mask layer 14, thereby to form a double-gate FET configuration. It is not necessary for the hard mask 14 to be thick.

In another embodiment, a sacrificial gate is formed as described aforesaid using sacrificial gate material instead of desired gate material. Thereafter, a gate replacement process is performed to replace the sacrificial gate with a desired gate structure. The gate structure may include a gate dielectric layer and a gate. For example, a sacrificial gate is formed of polysilicon, and thereafter a gate dielectric layer and a metal gate are formed through, for example, a conventional gate replacement process.

Figure 11:
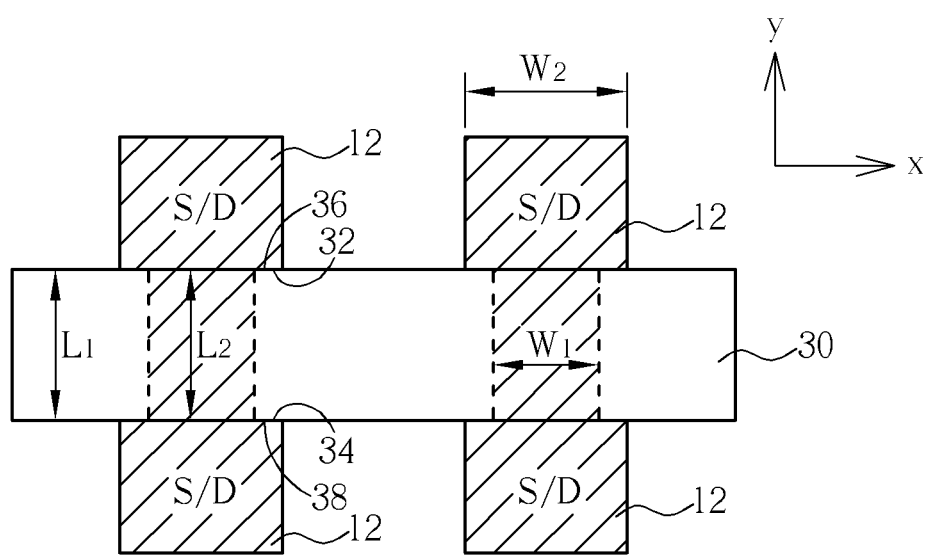
FIG. 11 is a schematic plan view illustrating a FET with a fin structure according to an embodiment of the present invention.
Figure 12:
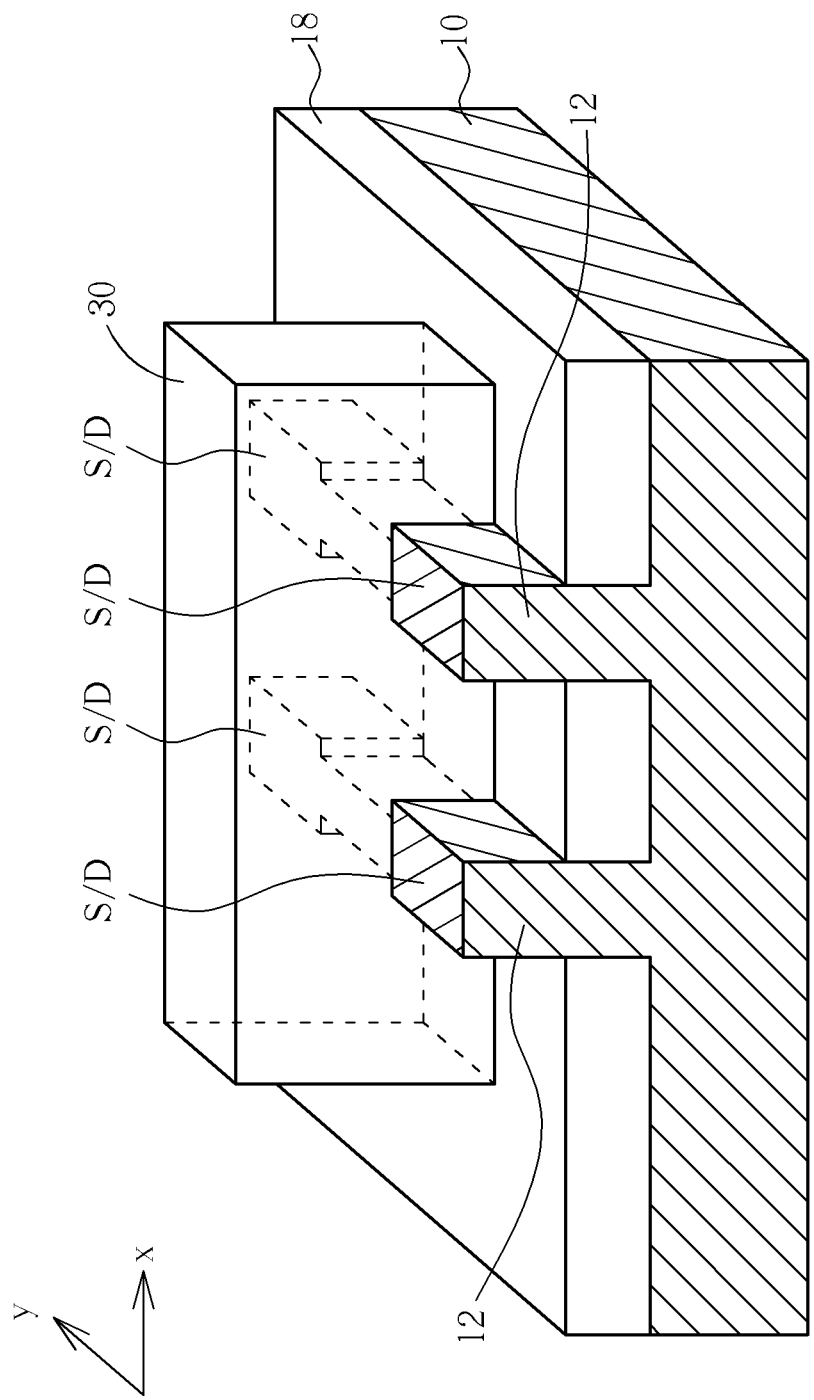
FIG. 12 is a schematic perspective view illustrating a FET with a fin structure according to an embodiment of the present invention.

FIG. 11 shows a schematic plan view and FIG. 12 shows a schematic perspective view, both illustrating more in detail a FET with a fin structure according to one aspect of an embodiment of the present invention. It clearly indicates that the channel width $W_1$ covered with the gate structure 30 is less than the width $W_2$ of the source/drain region, that the width $L_1$ of the gate structure 30 is the same as the channel length $L_2$ of the trimmed gate channel, and that two sidewalls 32 and 34 of the gate structure 30 contact two sidewalls 36 and 38, which face each other, of the two source/drain regions S/D, respectively, without a gap existing between the sidewall 32 and the sidewall 36 or between the sidewall 34 and the sidewall 38. In other words, the two sidewalls 32 and 34 of the gate structure 30 are aligned with two edges of the channel region. The two edges of the channel region are the two edges opposite to each other in the lengthwise direction of the channel region.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a field effect transistor with a fin structure, comprising:
    providing a substrate;
    forming at least one fin structure on the substrate;
    forming a planar first insulation layer on the substrate to cover the fin structure;
    partially removing the first insulation layer to a depth to form a trench, wherein the trench is over portions of the fin structure and a lengthwise direction of the trench intersects a lengthwise direction of the fin structure, thereby to expose an upper portion of the fin structure to the trench; and
    forming a gate structure covering the exposed upper portion of the fin structure in the trench.

2. The method according to claim 1, further, after forming the trench and before forming the gate structure, comprising:
    performing a trim process to reduce a width of the exposed upper portion of the fin structure.

3. The method according to claim 1, wherein, forming the first insulation layer on the substrate comprises steps as follows:
    forming a planar second insulation layer on the substrate and covering the fin structure;
    partially removing the second insulation layer to the depth to expose the upper portion of the fin structure;
    forming an etch stop layer on the second insulation layer and the exposed upper portion of the fin structure; and
    forming a third insulation layer covering the etch stop layer.

4. The method according to claim 3, wherein, partially removing the first insulation layer to form the trench comprises:
    partially removing the third insulation layer to the etch stop layer to form the trench.

5. The method according to claim 4, further comprising:
    removing the etch stop layer in the trench.

6. The method according to claim 1, wherein forming the first insulation layer on the substrate comprises steps as follows:
    forming a planar second insulation layer to cover the fin structure;
    partially removing the second insulation layer to the depth to expose the upper portion of the fin structure; and
    forming a third insulation layer covering the second insulation layer and the exposed upper portion of the fin structure, wherein the third insulation layer and the second insulation layer have different etching rates.

7. The method according to claim 6, wherein, partially removing the first insulation layer to form the trench comprises:
    partially etching the third insulation layer to the second insulation layer to form the trench.

8. The method according to claim 1, wherein, forming the gate covering the exposed upper portion of the fin structure in the trench comprises steps as follows:
    forming a gate dielectric layer on the fin structure in the trench;
    filling the trench with a gate material; and
    performing a planarization process on the gate material and the first insulation layer to expose the gate material and the first insulation layer.

9. The method according to claim 8, wherein, the fin structure is further covered with a hard mask layer, and the planarization process is performed to expose the gate material, the first insulation layer and the hard mask layer.

10. The method according to claim 1, wherein, forming the gate structure covering the exposed upper portion of the fin structure in the trench comprises steps as follows:
    filling the trench with a sacrificial gate material;
    performing a planarization process on the sacrificial gate material and the first insulation layer to expose the sacrificial gate material and the first insulation layer; and
    performing a gate structure replacement process to replace the sacrificial gate material with the gate structure.

11. The method according to claim 10, wherein, the fin structure is further covered with a hard mask layer, and the planarization process is performed to expose the sacrificial gate material, the first insulation layer and the hard mask layer.

12. The method according to claim 1, further, after forming the gate, comprising:
    removing the rest of the first insulation layer to the depth to expose the gate structure and the fin structure; and
    forming a source and a drain in the fin structure at two sides of the gate structure.

* * * * *